United States Patent
Lee et al.

(10) Patent No.: US 7,812,672 B2
(45) Date of Patent: Oct. 12, 2010

(54) LOW NOISE AMPLIFIER HAVING IMPROVED LINEARITY

(75) Inventors: Seung-Wook Lee, Seoul (KR); Deok Hee Lee, Seoul (KR); Eunseok Song, Seoul (KR); Joonbae Park, Seoul (KR); Kyeongho Lee, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 0 days.

(21) Appl. No.: 11/976,911

(22) Filed: Oct. 29, 2007

(65) Prior Publication Data

US 2008/0252377 A1 Oct. 16, 2008

(30) Foreign Application Priority Data

Oct. 30, 2006 (KR) ............... 10-2006-0105463

(51) Int. Cl.
*H03F 3/30* (2006.01)
(52) U.S. Cl. .......................... 330/279; 330/136
(58) Field of Classification Search ............ 330/311, 330/283, 136, 296
See application file for complete search history.

(56) References Cited

U.S. PATENT DOCUMENTS

| 5,936,464 | A  | * | 8/1999 | Grondahl | ............... 330/10 |
| 6,717,980 | B1 | * | 4/2004 | Rishi     | ............... 375/219 |
| 7,164,321 | B2 | * | 1/2007 | Behzad    | ............... 330/311 |
| 7,321,266 | B2 | * | 1/2008 | Chiang    | ............... 330/254 |

* cited by examiner

*Primary Examiner*—Robert Pascal
*Assistant Examiner*—Hieu P Nguyen

(57) ABSTRACT

Embodiments of the present general inventive concept include a low noise amplifier and method with an improved linearity while reducing a noise disadvantage (e.g., increase). One embodiment of a low noise amplifier can include a first transistor to receive an input signal at a control terminal thereof, a second transistor having a first terminal coupled to a second terminal of the first transistor, an envelope detector to output a control signal corresponding to a characteristic of the input signal and an envelope amplifier to amplify the control signal to be applied to a control terminal of the second transistor.

14 Claims, 3 Drawing Sheets

LOW NOISE AMPLIFIER HAVING IMPROVED LINEARITY

CROSS-REFERENCE TO RELATED APPLICATIONS

This application claims priority under 35 U.S.C. §119 (a) from Korean Patent Application No. 10-2006-0105463, filed on Oct. 30, 2006, in the Korean Intellectual Property Office, the disclosure of which is incorporated herein by reference in its entirety.

BACKGROUND OF THE INVENTION

1. Field of the Invention

The present application relates to a low noise amplifier, and apparatuses and methods for the same.

2. Description of the Related Art

FIG. 1 is a diagram schematically illustrating a general transceiver circuit. As illustrated in FIG. 1, the transceiver circuit includes a base band processor 10, a DAC (digital-to-analog converter) 12, an up-conversion mixer 14, a power amplifier 16, a duplexer 18, an antenna 20, a low noise amplifier 22, a down-conversion mixer 24, a variable gain amplifier 26, a filter 28, an ADC (analog-to-digital converter) 30 and a local oscillator 32.

In FIG. 1, since the low noise amplifier 22 is a first amplifier in a receiving path, a noise figure or noise amount of the low noise amplifier 22 is directly added to a noise figure or amount of an entire receiving path. Therefore, among the amplifiers 22 and 26 in the receiving path, the low noise amplifier 22 affects the noise figure of the entire receiving path the most. Therefore, the low noise amplifier 22 in particular should be designed to have a small noise figure.

In the low noise amplifier 22, linearity is an important factor since a single-tone desensitization and a cross modulation interference may occur because of a non-linearity. For instance, when an AMPS (Advanced Mobile Phone System) channel having a high signal level exists adjacent to a CDMA (Code Division Multiple Access) receiving channel that is a desired signal (e.g., spaced apart by 900 KHz), the AMPS channel acts as a single-tone interferer on the CDMA receiving channel. When the non-linearity exists in the low noise amplifier 22, a sensitivity for the CDMA receiving channel, which is the desired signal, is reduced by a signal of the AMPS channel (e.g., a gain is reduced). Such phenomenon is referred to as the single-tone desensitization.

In addition, when a CDMA transmitting channel signal leaks to the low noise amplifier 22 from the duplexer 18, the cross modulation interference can occur between the CDMA transmitting channel signal and the single-tone interferer. The cross modulation interference has a bandwidth corresponding to a bandwidth of a CDMA transmitting channel centered at the single-tone interferer. Therefore, the cross modulation interference can generate an interference of the CDMA receiving channel adjacent to the single-tone interferer.

To suppress the single-tone desensitization and the cross modulation interference (e.g., described above), the linearity of the low noise amplifier 22 should be improved. One easy method to improve the linearity of the amplifier is to increase a bias current. However, when the bias current is increased, a power consumption is increased, which decreases a lifespan of a battery of a mobile device. Therefore, a method for reducing or minimizing the power consumption while improving the linearity is required.

An example of the method is disclosed by a paper "Vincent W Leung, Junxiong Deng, Prasad S. Gudem, and Lawrence E. Larson, Analysis of Envelope Signal Injection for Improvement of RF Amplifier Intermodulation Distortion, IEEE Journal of Solid-State Circuits, Vol. 40, No. 9, September 2005, pp. 1888-1894" wherein the bias current is minimized when an input signal is small and the bias current is increased when the input signal is large. An amplifier and an operation thereof disclosed in the paper are shown in FIGS. 2a and 2b, respectively.

As illustrated in to FIG. 2a, the amplifier additionally includes a envelope detector 32 compared to a conventional amplifier. The envelope detector 32 detects a mean signal power and adjusts a bias current of a transistor 34 according to the detected mean signal power. When a power of an input signal increases, the bias current of the transistor is increased, whereby a load line is changed as shown in FIG. 2b. As a result, when the power of the input signal is small, an amplification is carried out using a small bias current. When the power of the input signal is large, an amplification is carried out using a large bias current. Therefore, a mean power consumption is reduced.

However, while the amplifier of FIGS. 2a-2b has a high linearity and a low power consumption, the amplifier has various disadvantageous. For example, the noise figure of the amplifier is increased. More specifically, since the output of the envelope detector 32 is connected to an input terminal of the transistor 34, a noise added by the envelope detector 32 such as a thermal noise is amplified and outputted to affect the noise figure of the amplifier. For at least such reasons, the amplifier is mainly used for a power amplifier such as power amplifier 16 where the noise figure is relatively unimportant.

The above references are incorporated by reference herein where appropriate for appropriate teachings of additional or alternative details, features and/or technical background.

SUMMARY OF THE INVENTION

An object of the application is to solve at least the above problems and/or disadvantages or to provide at least the advantages described herein in whole or in part.

Another object of the application to provide a low noise amplifier having a high linearity, or a low power consumption and/or a low noise figure.

To achieve objects and/or utilities of embodiments of the application in whole or in part, there is provided a low noise amplifier that can include a first transistor to receive an input signal at a control terminal, a second transistor configured to couple a first terminal to a second terminal of the first transistor and to provide an amplifier output signal, an envelope detector to output a signal representative of the input signal and an envelope amplifier to amplify the signal of the envelope detector to apply to a control terminal of the second transistor.

To achieve objects and/or utilities of embodiments of the application in whole or in part, there is provided an amplifier that can include a cascode amplifier to receive an input signal, the cascode amplifier configured to include a common source amplifier and a common gate amplifier and an envelope detector to apply a representative signal corresponding to a signal power of the input signal to a control terminal of the common gate amplifier.

To achieve objects and/or utilities of embodiments of the application in whole or in part, there is provided a receiving circuit that can include a low noise amplifier to amplify an input signal, a mixer to down-convert an output signal of the low noise amplifier, a variable gain amplifier to amplify an output signal of the mixer, a filter to filter an output signal of the variable gain amplifier and an ADC to convert an output signal of the filter to a digital signal, wherein the low noise amplifier can include a cascode amplifier to receive an input signal, the cascode amplifier configured to include a common source amplifier and a common gate amplifier, an envelope detector to apply a representative signal corresponding to a signal power of the input signal to a control terminal of the common gate amplifier and an envelope amplifier coupled between the envelope detector and the control terminal of the common gate amplifier, the envelope amplifier to amplify the representative signal to be applied to a control terminal of the common gate amplifier.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF EMBODIMENTS

Exemplary embodiments according to the present general inventive concept will now be described in detail with reference to the accompanied drawings. The interpretations of the terms and wordings used in description and claims should not be limited to common or literal meanings. Exemplary embodiments of the application are provided to describe the general inventive concept more thoroughly for those skilled in the art.

Figure 3:
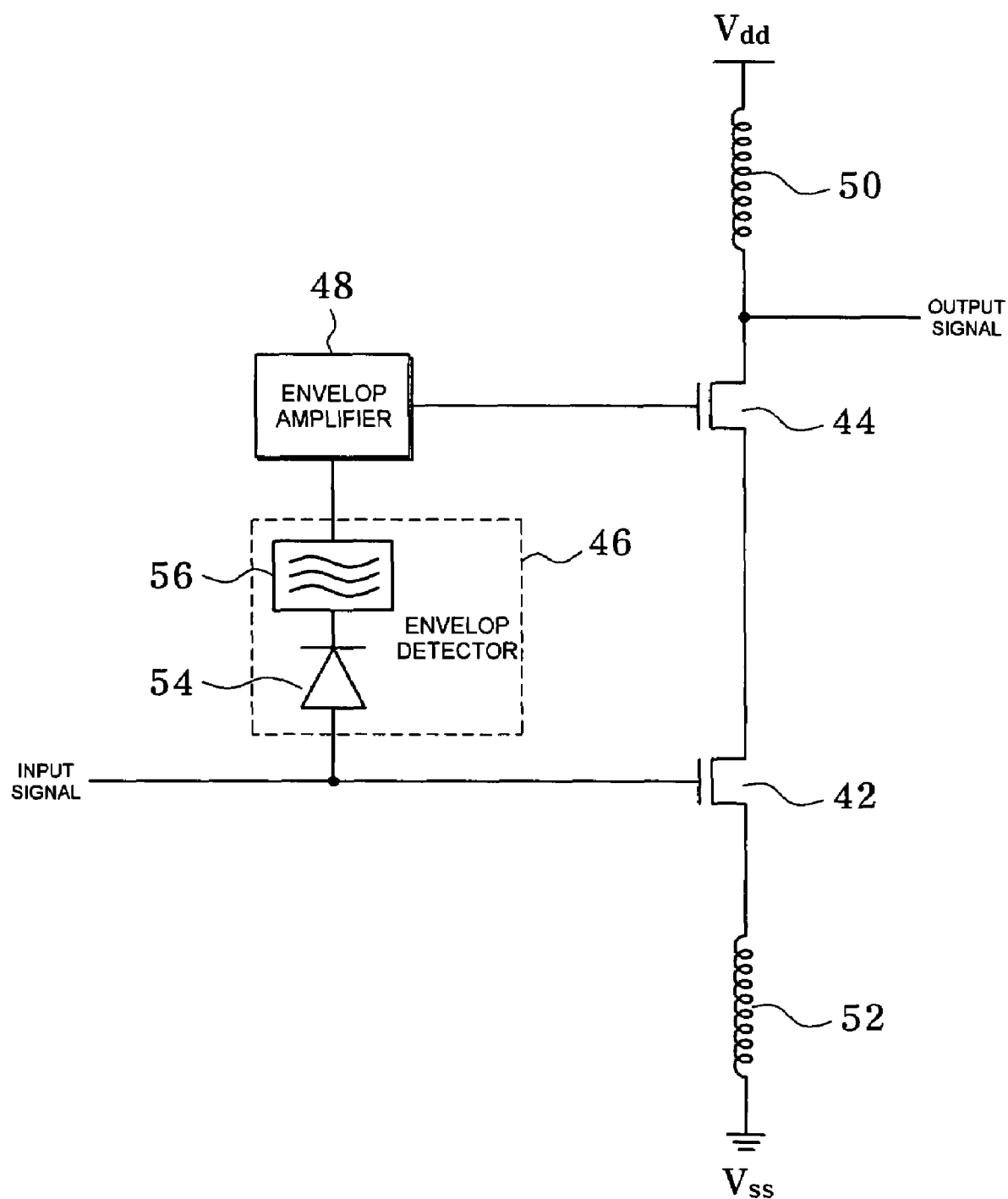
FIG. 3 is a diagram illustrating an embodiment of amplifier in accordance with the application.

FIG. 3 is a diagram illustrating an embodiment of an amplifier in accordance with the application. As shown in FIG. 3, the amplifier can include a common source amplifier 42, a common gate amplifier 44, an envelope detector 46 and a envelope amplifier 48. In addition, the amplifier may further include a first inductor 50 and a second inductor 52.

The common source amplifier 42 and the common gate amplifier 44 are preferably interconnected to form a cascode amplifier. An input signal can be applied to a gate of the common source amplifier 42, and an output signal can be outputted from a drain of the common gate amplifier 44.

The envelope detector 46 can measure a mean signal power of the input signal, and output a signal corresponding to the measured mean signal power. The envelope detector 46 may simply be embodied by a diode 54 and a low pass filter 56. However, embodiments of the application are not intended to be limited by such an exemplary disclosure.

The envelope amplifier 48 can amplify and output the signal being outputted from the envelope detector 46. The term "envelope" of the envelope amplifier 48 is used in a meaning that the signal outputted from the envelope detector 46 is amplified, not to represent a special meaning. For example, a general amplifier or the like may be used as the envelope amplifier 48. The envelope amplifier 48 may be an inverting amplifier, or a non-inverting amplifier. It is preferable that a gain of the envelope amplifier 48 is set such that a gain β of an envelope path described herein satisfies prescribed parameters. Thus, it is preferable that a gain of the envelope amplifier 48 is set such that a gain β of a envelope path satisfies equation 3, which is described herein. In order to achieve this, the envelope amplifier 48 may be a variable gain amplifier.

The first inductor 50 can be coupled between a drain of the common gate amplifier 44 and a first power supply Vdd to provide an output impedance matching.

The second inductor 52 can be coupled between a source of the common source amplifier 42 and a second power supply Vss to provide a noise matching and/or an input impedance matching.

Operations of an amplifier according to the application will now be described. As illustrated in FIG. 3, a large signal equation of the common source amplifier 42 may be expressed as equation 1.

$$I_{DS} = \frac{1}{2}\mu_n C_{OX} \frac{W}{L}(1+\lambda V_{DS})(V_{GS}-V_{TH})^2 \qquad \text{[Equation 1]}$$

where $I_{DS}$ is a drain current of the common source amplifier 42, $\mu_n$ is a mobility of an electron, $C_{OX}$ is a capacitance of an oxide film per unit area, W is a width, L is a length, λ is a channel length modulation coefficient, $V_{DS}$ is a voltage between a drain and the source of the common source amplifier 42, $V_{GS}$ is a voltage between the gate and the source of the common source amplifier 42, and $V_{TH}$ is a threshold voltage of the common source amplifier 42.

Assuming that an input small signal is $v_{in}$, and an envelope signal $\beta v^2_{in}$ is applied to the drain of the common source amplifier 42 by the envelope detector 46 and the common gate amplifier 44, a small signal drain current $i_{DS}$ of the common source amplifier 42 may be expressed as equation 2.

$$i_{DS} = k(1+\lambda\beta v^2_{in})(g_1 v_{in} + g_2 v^2_{in} + g_3 v^3_{in} + \ldots) \qquad \text{[Equation 2]}$$
$$= kg_1 v_{in} + kg_2 v^2_{in} + (kg_3 + k\lambda\beta g_1)v^3_{in} + \ldots$$

where $$k = \frac{1}{2}\mu_n C_{OX}\frac{W}{L},$$

β is the gain of the envelope path (a path from an input of the envelope detector 46 to a source of the common gate amplifier 44), and $g_1$, $g_2$ and $g_3$ are a first order coefficient, a second order coefficient and a third order coefficient of a polynomial respectively, when a non-linearity of an output to an input of the common source amplifier 42 is expressed as the polynomial.

In order to improve the linearity of the amplifier in accordance with embodiments of the application, the third order coefficient is very small and preferably set to zero. Therefore, β may be expresses as equation 3.

$$\beta = -\frac{g_3}{\lambda g_1} \qquad \text{[Equation 3]}$$

When β satisfies equation 3, the linearity of an amplifier in accordance with the application is increased or optimally improved since a third term is removed. When polarities of $g_1$ and $g_3$ are identical, the envelope amplifier 48 should be the inverting amplifier since β is a negative number. When the polarities of $g_1$ and $g_3$ are different, the envelope amplifier 48 should be the non-inverting amplifier since β is a positive number. For example, in case of an N channel MOSFET (Metal-Oxide Semiconductor Field Effect Transistor), the polarities of $g_1$ and $g_3$ are identical in a moderate inversion region, and the polarities of $g_1$ and $g_3$ are different in a strong inversion region.

In FIG. 3, the output signal may be outputted from the drain of the common gate amplifier 44. However, embodiments of the application are not intended to be limited by such an exemplary disclosure. For example, the output signal may be outputted from the drain of the common source amplifier 42. It is understood by the skilled in the art that equations 1 through 3 may be similarly applied.

In FIG. 3, while the N channel transistor (e.g., MOSFET) is used to embody the common source amplifier 42 and the common gate amplifier 44, embodiments of the application are not intended to be limited by such an exemplary disclosure. For example, the common source amplifier 42 and the common gate amplifier 44 may be embodied using a p channel transistor or the like.

As described, embodiments of an amplifier in accordance with the present general inventive concept have various advantages. For example, embodiments of an amplifier or methods thereof can concurrently satisfy high linearity and/or low power consumption since the third order coefficients may be set to zero or substantially zero without increasing a large amount of the drain current. For example, in a method where the bias current is increased to improve the linearity, a twice larger current should be provided in order to improve the linearity of 3 dB. However, since embodiments of an amplifier in accordance with the application can improve the linearity by setting the third order coefficient to zero instead of increasing the bias current, a large amount of current is not required.

Figure 1:
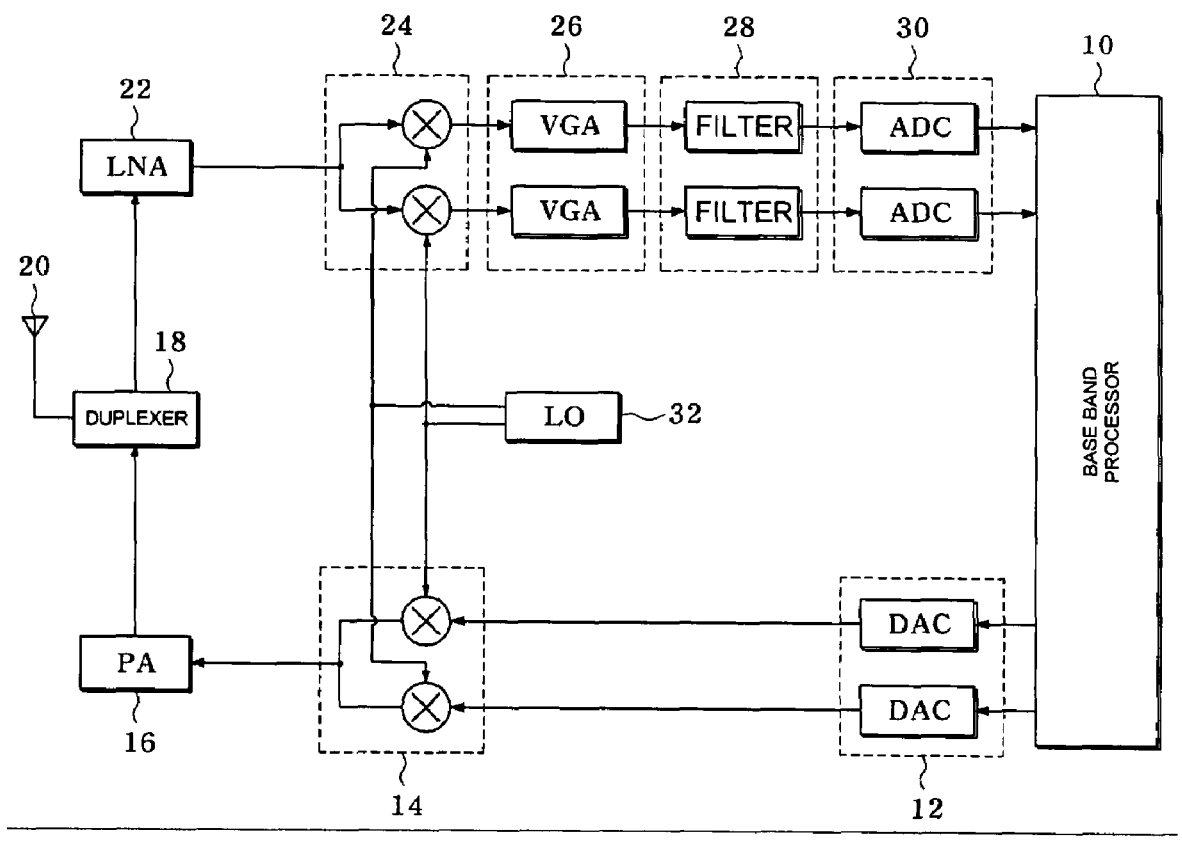
FIG. 1 is a diagram schematically illustrating a general transceiver circuit.
Figure 2A:
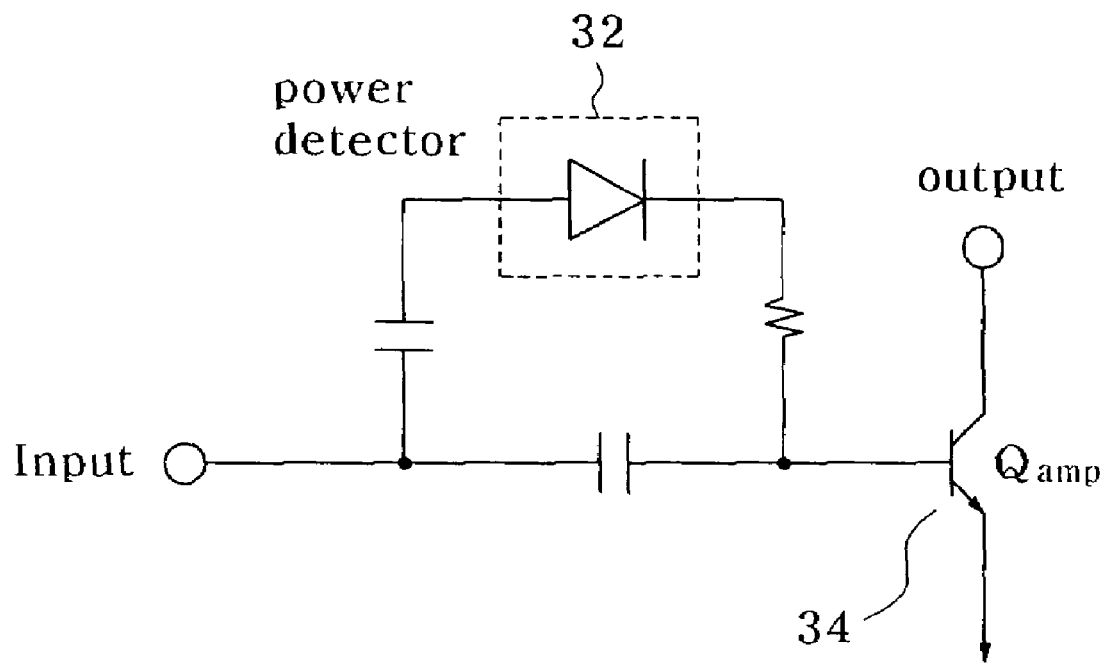
FIGS. 2a-2b are diagrams illustrating a related art amplifier and an operation thereof.
Figure 2B:
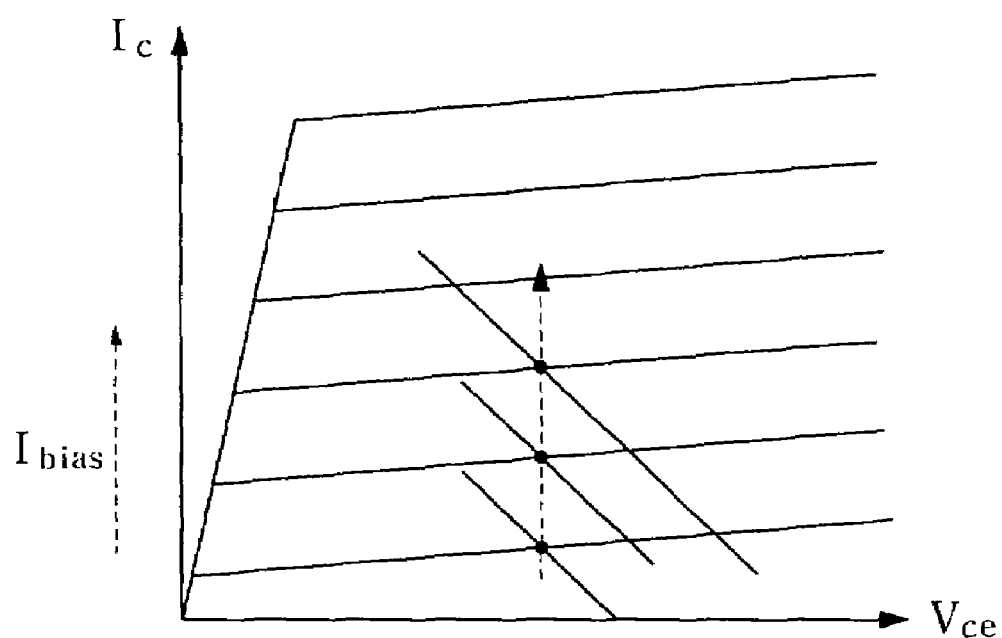

In addition, contrary to the related art amplifier, embodiments of an amplifier or methods thereof include advantages in that the noise figure is not sacrificed or increased. More specifically, the related art amplifier shown in FIG. 2a is disadvantageous because the noise figure is greatly increased by the envelope detector since a noise generated in the envelope detector is inputted to an amplifier by the transistor 34. However, in accordance with embodiments of an amplifier and methods thereof, an output of an envelope detector is not inputted to the input terminal of the common source amplifier 42. For example, an output of an envelope detector can be used to control the common source amplifier 42 (e.g., a drain voltage) so that the noise figure is not increased or not greatly increased.

Moreover, embodiments of an amplifier in accordance with the application have an advantage because such amplifiers may be used as a low noise amplifier included in a receiving circuit.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A low noise amplifier, comprising:
a first transistor to receive an input signal at a control terminal;
a second transistor configured to couple a first terminal to a second terminal of the first transistor and to provide an amplifier output signal;
an envelope detector to output a signal representative of the input signal; and
an envelope amplifier to amplify the signal of the envelope detector to apply to a control terminal of the second transistor, wherein a gain of an envelope path β of the envelope amplifier is $\beta=-g.sub.3/(\lambda.g.sub.1)$, where λ is a channel length modulation coefficient, g.sub.1 and g.sub.3 are respectively a first order coefficient and a third order coefficient of a polynomial when a nonlinearity of an output to an input of the first transistor is represented as the polynomial.

2. The amplifier in accordance with claim 1, wherein the envelope detector comprises:
a diode to receive the input signal; and
a low pass filter to receive an output of the diode.

3. The amplifier in accordance with claim 1, wherein an output terminal of the low noise amplifier is configured to be the second terminal of the second transistor or the second terminal of the first transistor.

4. The amplifier in accordance with claim 1, comprising a first inductor coupled to a second terminal of the second transistor and a first power supply.

5. The amplifier in accordance with claim 4, comprising a second inductor coupled to a first terminal of the first transistor and a second power supply.

6. The amplifier in accordance with claim 1, wherein the control terminal, the first terminal and the second terminal are respectively a gate, source and drain electrode of the transistor, wherein the first and second transistors are MOSFET transistors, and wherein the signal representative of the input signal corresponds to a mean power signal of the input signal.

7. The amplifier in accordance with claim 1, wherein the first transistor is configured to receive only the input signal at the control terminal.

8. An amplifier comprising:
a cascode amplifier to receive an input signal, the cascode amplifier configured to include a common source amplifier and a common gate amplifier;

an envelope detector to apply a representative signal corresponding to a signal power of the input signal to a control terminal of the common gate amplifier, and a envelope amplifier coupled between the envelope detector and the control terminal of the common gate amplifier, the envelope amplifier to amplify the representative signal envelope to be applied to the control terminal of the common gate amplifier, wherein a gain of the envelope amplifier is set such that a gain of an envelope path β satisfies a equation $$\beta = -\frac{g_3}{\lambda g_1},$$

where λ is a channel length modulation coefficient, $g_1$ and $g_3$ are respectively a first order coefficient and a third order coefficient of a polynomial when a non-linearity of an output to an input of the common source amplifier is expressed as the polynomial.

9. The amplifier in accordance with claim 8, wherein the envelope detector comprises:
a diode to receive the input signal; and
a low pass filter to receive an output of the diode.

10. The amplifier in accordance with claim 8, wherein the common source amplifier comprises a first transistor with a control terminal to receive the input signal, a second terminal coupled to the common gate amplifier and a first terminal coupled to a first power supply through a first inductor, and
wherein the common gate amplifier comprises a second transistor with a first terminal coupled to a second terminal of the first transistor and a second terminal coupled through a second inductor to a second power supply, wherein the output signal is output from the second terminal.

11. A receiving circuit comprising:
a low noise amplifier to amplify an input signal;
a mixer to down-convert an output signal of the low noise amplifier;
a variable gain amplifier to amplify an output signal of the mixer;
a filter to filter an output signal of the variable gain amplifier; and
an ADC to convert an output signal of the filter to a digital signal, wherein the low noise amplifier comprises,
a cascode amplifier to receive an input signal, the cascode amplifier configured to include a common source amplifier and a common gate amplifier,
an envelope detector to apply a representative signal corresponding to a signal power of the input signal to a control terminal of the common gate amplifier, and
an envelope amplifier coupled between the envelope detector and the control terminal of the common gate amplifier, the envelope amplifier to amplify the representative signal to be applied to a control terminal of the common gate amplifier, wherein a gain of the envelope amplifier is set such that a gain of a envelope path β satisfies a equation $$\beta = -\frac{g_3}{\lambda g_1},$$

where λ is a channel length modulation coefficient, $g_1$ and $g_3$ are respectively a first order coefficient and a third order coefficient of a polynomial when a non-linearity of an output to an input of the common source amplifier is expressed as the polynomial.

12. The receiving circuit in accordance with claim 11, wherein the envelope detector comprises:
a diode to receive the input signal; and
a low pass filter to receive an output of the diode.

13. The receiving circuit in accordance with claim 11, wherein the signal representative signal corresponds to a mean power signal of the input signal.

14. The receiving circuit in accordance with claim 11, comprising:
a second terminal of the second transistor is coupled to a second prescribed voltage,
the common source amplifier to receive only the input signal at the control terminal, and the common source amplifier to couple a first terminal to a first reference voltage,
the common gate amplifier to couple a first terminal to a second terminal of the common source amplifier to provide an amplifier output signal to the common source amplifier, and the common gate amplifier to couple a second terminal to a second reference voltage.

* * * * *